(12) United States Patent
Di Martino et al.

(10) Patent No.: US 12,019,096 B2
(45) Date of Patent: Jun. 25, 2024

(54) SENSOR-BASED PLANAR WAFER PROBE ALIGNMENT

(71) Applicant: Infineon Technologies AG, Neubiberg (DE)

(72) Inventors: Stefano Di Martino, Graz (AT); Thomas Thurner, Graz (AT)

(73) Assignee: Infineon Technologies AG, Neubiberg (DE)

( * ) Notice: Subject to any disclaimer, the term of this patent is extended or adjusted under 35 U.S.C. 154(b) by 520 days.

(21) Appl. No.: 17/225,462

(22) Filed: Apr. 8, 2021

(65) Prior Publication Data

US 2022/0326279 A1 Oct. 13, 2022

(51) Int. Cl.
*G01R 1/067* (2006.01)
*G01R 31/28* (2006.01)

(52) U.S. Cl.
CPC ....... *G01R 1/06738* (2013.01); *G01R 1/0675* (2013.01); *G01R 31/2891* (2013.01)

(58) Field of Classification Search
CPC .............. G01R 1/06738; G01R 1/0675; G01R 31/2891; G01R 1/06794
See application file for complete search history.

(56) References Cited

U.S. PATENT DOCUMENTS

| | | | |
|---|---|---|---|
| 5,267,471 A * | 12/1993 | Abraham | G01Q 20/02 977/863 |
| 5,347,226 A | 9/1994 | Bachmann et al. | |
| 5,883,519 A * | 3/1999 | Kennedy | G01R 1/07 324/755.07 |
| 6,924,653 B2 * | 8/2005 | Schaeffer | G01R 31/2886 324/750.25 |
| 7,420,106 B2 * | 9/2008 | Williams | G01Q 60/04 977/854 |
| 8,104,093 B2 | 1/2012 | Sandhu | |

(Continued)

FOREIGN PATENT DOCUMENTS

| | | |
|---|---|---|
| CN | 104714054 A * | 6/2015 |
| KR | 102062470 B1 | 2/2020 |
| WO | 2009118887 A1 | 10/2009 |

OTHER PUBLICATIONS

English machine translation of Peng et al. CN-104714054-A (Peng) (Year: 2015).*

(Continued)

*Primary Examiner* — Vinh P Nguyen
(74) *Attorney, Agent, or Firm* — Harrity & Harrity, LLP

(57) ABSTRACT

A wafer probe alignment system includes a test probe needle including a body having a tip that is configured to make contact with a surface of a wafer at a first tip position, wherein the body is deformable and includes a sensing area that undergoes a deformation in response to at least one force, including a lateral friction force, applied to the tip; at least one sensor configured to monitor the sensing area for deformation caused by a lateral friction force and generate at least one first sensor information representative of the lateral friction force; and a controller configured to control a position of the tip, wherein the controller is configured to receive the at least one first sensor information and reposition the tip to counteract the lateral friction force in order to maintain the tip at the first tip position.

17 Claims, 7 Drawing Sheets

(56) References Cited

U.S. PATENT DOCUMENTS

2010/0327894 A1  12/2010  Dang et al.
2013/0106455 A1  5/2013  Edwards et al.

OTHER PUBLICATIONS

"Introduction to Strain Gauges and their usage." Techni Measure. Techni Measure Ltd. 2019. https://www.technimeasure.co.uk/about-us/information/introduction-to-strain-gauges/. Accessed Feb. 5, 2021.
"Ships machinery—Torsionmeters & measurement of torsion." Machinery Spaces, 2010-2016, www.machineryspaces.com/Torsionmeters.html. Accessed Feb. 5, 2021.
"Strain Measurement Using Strain Gage Sensors." Strain measurement | Dewesoft Training Portal, Dewesoft d.o.o., 2000-2021, https://training.dewesoft.com/online/course/strain-measurement#/wheatstone-bridge. Accessed Feb. 2, 2021.
"The Wheatstone Bridge Circuit Explained Learn the basics and theory of operation." Wheatstone Bridge Circuit | Strain Gauge | HBM, HBK Company, Mar. 8, 2021, https://www.hbm.com/en/7163/wheatstone-bridge-circuit/. Accessed Mar. 8, 2021.
"Types of Strain Gauge : Characteristics & Applications." Elprocus, 2013-2021, https://www.elprocus.com/types-of-strain-gauge/. Accessed Feb. 2, 2021.

* cited by examiner

SENSOR-BASED PLANAR WAFER PROBE ALIGNMENT

BACKGROUND

In semiconductor integrated circuit manufacturing, it is common practice to test integrated circuits ("IC's") during manufacturing (e.g., prior to packaging) and prior to shipment to ensure proper operation. Wafer testing is a well-known testing technique commonly used in production testing and post-silicon verification of semiconductor IC's, wherein a temporary electrical connection is established between automatic test equipment (ATE) and each IC formed on the wafer to demonstrate proper performance of the IC. Conductive probes, such as probe needles, may be positioned to establish electrical contact with a series of connection terminals (or "die contacts") on the IC wafer. The testing process involves initially establishing electrical contact between probes and the wafer, and thereafter running a series of tests on the devices that are on the wafer's surface. There is a need for highly accurate measurements, requiring high quality, unchanged electrical interface between wafer pads and probes, for verification tasks at the wafer-level.

In some applications, multiple test probes need to be applied to respective wafer pads or bumps to perform a test. For example, in radio frequency (RF) or switching applications, two test probes that are electrically insulated from each other can be used to establish an RF current path. These on-wafer RF measurements typically use cantilever and/or lithographic-constructed test probes ("RF probes"), and, as noted above, multiple probes can be required for such setups for biasing and IN/OUT probing of the device under test (DUT).

For high-quality measurements (impedance matching, repeatability, contact resistance, etc.), precise positioning of the test probes on wafer pads is required. For example, accuracy in range of less than 2-3 μm in all three dimensions (e.g., x, y, and z dimensions) may be required for probe positioning. Testing may be performed over several hours or even days over a large range of temperatures (e.g., −50 . . . +150° C.), which also impacts accurate positioning. However, using a signal probe or multiple conventional test probes to contact a single pad or bump has proven to be difficult, especially over longer testing periods, for several reasons. Sometimes the test pad or bump presents an uneven surface that makes it difficult to maintain contact. For example, conventional test probes have a tendency to misalign or slip off bumps in presence of external factors, causing the electrical interface to vary. For example, a change in lateral frictional force acting on the test probe, a change in vertical contacting force acting on the test probe, or a misalignment due to probe tip drift can result in different electrical contact resistances or different capacitive coupling that changes the electrical measurements.

Even if contact can be maintained, conventional test probes are relatively large compared to test pads and bumps. This requires that the conventional test probes be spaced apart and angled so that the tips can make contact with the test point. The distance between the probes, probe cross sectional area and probe length all have a direct effect on the inductance of the forward and reverse paths. A larger probe pitch, larger cross sectional area and longer probe length generally cause an increase in the path inductance, which is undesirable in RF or switching applications. Also, two test probes may exert different contact forces on a test point, which causes uneven tip wear and also uneven scrubbing on the test point. Such precise positioning of RF probes at the wafer-level is at the moment not possible for mid-term and long-term measurements, especially under varying temperature conditions (e.g., −50 . . . +150° C.).

Therefore, an improved test probe system capable of detecting probe drift and displacements and performing position compensation preferably prior to probe drift and displacement may be desirable.

SUMMARY

At least one embodiment provides a wafer probe alignment system, including: a test probe needle including a body having a tip that is configured to make contact with a surface of a wafer at a first tip position, wherein the body is deformable and includes a sensing area that undergoes a deformation in response to at least one force applied to the tip, wherein the at least one force includes a first lateral friction force that is applied in a first lateral direction parallel to the surface of the wafer; at least one sensor configured to monitor the sensing area for deformation caused by the first lateral friction force and generate at least one first sensor information representative of the first lateral friction force; and a controller configured to control a position of the tip, wherein the controller is configured to receive the at least one first sensor information and reposition the tip to counteract the first lateral friction force in order to maintain the tip at the first tip position.

At least one embodiment provides a method of maintaining alignment of a test probe needle on a surface of a wafer at a first tip position, wherein the test probe needle includes a body having a tip that is configured to make contact with the surface of the wafer at the first tip position, wherein the body is deformable and includes a sensing area that undergoes a deformation in response to at least one force applied to the tip based on the contact with the surface of the wafer, wherein the at least one force includes a first lateral friction force that is applied in a first lateral direction parallel to the surface of the wafer. The method includes: monitoring, by at least one sensor, the sensing area for deformation caused by the first lateral friction force; generating, by the at least one sensor, at least one first sensor information representative of the first lateral friction force; and controlling, by a controller, a position of the tip, including repositioning the tip based on the at least one first sensor information in order to counteract the first lateral friction force and to maintain the tip at the first tip position.

At least one embodiment provides a wafer probe alignment system, including: a first test probe needle including a body having a tip that is configured to make contact with a wafer surface of a wafer at a first tip position; a signal generator configured to generate a first test signal, wherein the signal generator transmits the first test signal on a first signal path through the first test probe needle to the wafer surface, wherein the first test signal is reflected back through the first test probe needle along the first signal path by the wafer surface; and a characteristic detector test probe needle, wherein the characteristic detector is configured to receive the reflected first test signal reflected by the wafer surface, and evaluate a first characteristic of the reflected first test signal; and a controller configured to compare the evaluated first characteristic to a first reference characteristic, detect a first deviation on a condition that the evaluated first characteristic deviates from the first reference characteristic, and reposition the tip of the first test probe needle to counteract the first deviation in order to maintain the tip of the first test probe needle at the first tip position.

BRIEF DESCRIPTION OF THE DRAWINGS

Embodiments are described herein making reference to the appended drawings.

DETAILED DESCRIPTION

Figure 1A:
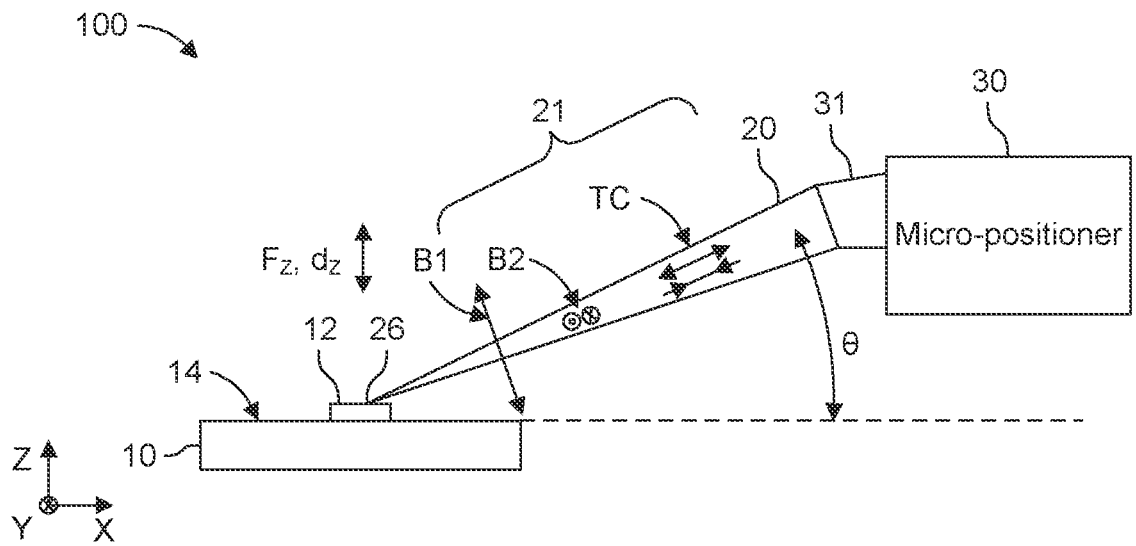
FIG. 1A is a side view of a wafer test probe system according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing a processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a DSP that performs some processing on the digital signal.

Embodiments are directed to integrated circuit testing and, more specifically, wafer probing of integrated circuits using, for example, cantilever and/or lithographic test probe needles. One or more sensors is used in combination with a probe positioner that controls and adjusts the position of a test probe needle based on sensor feedback. Each test probe needle has a body that is deformable in response to a friction force, displacement force, and/or a contacting force (e.g., pressure) acting thereon. Specifically, the body is deformable based on at least one force applied to the tip as a result of its contact with a surface of the wafer, which may include a surface of a conductive wafer pad, a semiconductor surface of the wafer itself, an insulation layer disposed on the semiconductor surface, a film layer deposited on the semiconductor surface, and so on.

The one or more sensors are used to monitor for and detect different types of deformation, including bending, twisting (torsion), compression (contraction), expansion (tension), shortening, stretching, or any other deformation resultant from an applied force. The probe positioner includes a controller that receives the sensor feedback and determines a movement, a displacement, or a position of a test probe needle based on the sensor feedback, and may further control the position of the test probe needle to take corrective measures to compensate its position based on any detected displacement.

Moreover, the probe positioner is capable of detecting friction forces based on sensor feedback and predicting a displacement of a test probe needle prior to the occurrence of the actual displacement. Using this predictive analysis, the probe positioner can compensate a position of the test probe needle prior to the occurrence of the actual displacement in order to prevent misalignment of the test probe needle with its target pad or bump.

As a result, the embodiments provide active, real-time repositioning of test probe needles in order to maintain proper contact pressure and alignment in all X, Y, and Z dimensions with respective target pads or bumps. For the purpose of this disclosure, wafer pads and wafer bumps refer to electrical contacts integrated on a surface of a semiconductor wafer and may be used interchangeably. Example embodiments will now be described in further detail in conjunction with the drawings.

Figure 1B:
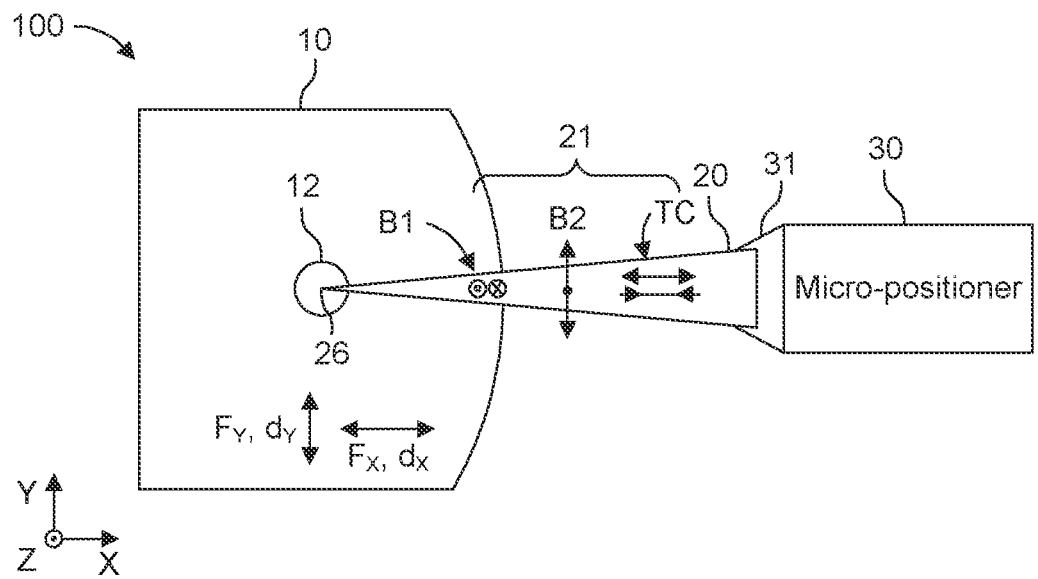
FIG. 1B is a top view of the wafer test probe system shown in FIG. 1A.

FIG. 1A is a side view of a wafer test probe system 100 according to one or more embodiments. FIG. 1B is a top view of the wafer test probe system 100 shown in FIG. 1A.

In particular, the wafer test probe system 100 includes a wafer 10 including a signal pad 12 arranged at a wafer surface 14 of the wafer 10. The signal pad 12 may be part of a wafer-mounted semiconductor integrated circuit that has a plurality of signal pads. While the signal pad is shown to be raised from the wafer surface 14, it may also be flush therewith. The wafer test probe system 100 further includes a test probe needle 20 that includes a sensing area 21 where sensors and/or sensor components can be arranged. The sensors and/or sensor components are used to measure lateral friction forces and lateral tip positioning. The sensors and/or sensor components may also be used to measure vertical contacting forces, vertical tip pressure, and vertical tip positioning. It will be appreciated that the sensing area 21 is not limited to any defined area of the test probe needle 20 but is merely presented for illustrative purposes. Thus, the sensing area 21 may include one or more areas of the test probe needle body at which a sensor or sensor component is mechanically coupled thereto.

In this case, the test probe needle 20 is a cantilever test probe needle comprising a tip 26 that is configured to make at least mechanical contact with a target area of the wafer 10, which may include any of the aforementioned wafer surfaces. Additionally, the test probe needle 20 may also make electrical contact with the target area. At the very least, the test probe needle 20 establishes an electrical relationship with the wafer 10, such as direct electrical contact that establishes a certain impedance or resistance between the test probe needle 20 and the wafer surface or an electrical coupling, such as a capacitive coupling, established between the test probe needle 20 and a conductive layer within the wafer 10.

In this example, the wafer surface is a surface of the signal pad 12. In this sense, the signal pad 12 is arranged at a certain location on the wafer 10 and represents a target area, and more specifically a target point of contact, to which the test probe needle 20 is to make and maintain mechanical contact therewith at a desired contact force (i.e., tip pressure, lateral pressure, etc.). The impedance or resistance at the point of contact depends on the contact force applied to the test probe needle 20 due to the mechanical contact with signal pad 12. Therefore, a desired impedance or resistance can be achieved by establishing a corresponding contact force.

The test probe needle 20 is further configured to inject a wafer test signal into the signal pad 12, extract a wafer test signal therefrom (e.g., injected by another test probe needle at a different signal pad that is electrically connected to signal pad 12), and measure an electrical characteristic, such as the aforementioned impedance, resistance, or capacitance, from the extracted wafer test signal. The test probe needle 20 may be expected to maintain mechanical contact with the signal pad 12 while maintaining an electrical characteristic at a constant value (i.e., target value) or within a predefined margin from a target value over a plurality of measurements that are carried out over a large range of temperatures (e.g., −50 . . . +150° C.).

The tip 26 is part of the body of the test probe needle 20 that is deformable based on at least one force applied to the tip 26 as a result of its mechanical contact with a signal pad 12. As a result, a deformation of the body also results in a deformation of the sensing area 21 that can be detected by sensors and/or sensor components disposed in the sensing area. A sensor component may be a sensor element or a reflective element (e.g., a mirror substrate) used in conjunction with an optical sensor monitoring the deformation of the sensing area 21.

The wafer test probe system 100 also includes a micro-positioner 30 that is electrically connected to the sensors for receiving sensor information (e.g., electrical sensor signals) therefrom. The micro-positioner 30 includes sensor circuit that includes processing circuitry (e.g., at least one processor) for processing and evaluating sensor signals received from sensors. The sensor circuit may also include portions of bridge circuits described herein (e.g., terminals and resistors R1-R6). The micro-positioner 30 also includes a controller (e.g., a microcontroller) that controls an actuator 31 via control signals based on determinations made by the processing circuitry of the sensor circuit. In some cases, the processing circuitry is integrated in the controller.

The micro-positioner 30 may record a target position in memory as a reference position and is configured to monitor and evaluate the sensor signals to measure various types of forces acting on the tip 26 and possible movements. The micro-positioner 30 may determine the reference position in response to the tip 26 making mechanical contact with the signal pad 12 and establishing a desired electrical characteristic between the test probe needle 20 and the wafer 10. The reference position may be established at a particular vertical contacting force and particular lateral friction forces while satisfying desired electrical characteristics (e.g., impedance, resistance, capacitance, etc.) between the tip 26 and the wafer 10. This determination may be performed at initial contact with the signal pad 12 and adjustments in tip position are made until the desired electrical characteristics are achieved.

Once the desired electrical characteristics are achieved, the micro-positioner 30 can record the tip position as a reference tip position and can further record sensor information read out from one or more sensors. The recorded sensor information correspond to the existing vertical and lateral forces acting on the tip 26 at the reference tip position with the desired electrical characteristics. The micro-positioner 30 can use the recorded sensor information as one or more reference values that are then compared to measured sensor information for detecting external forces acting on the tip 26 that may cause the electrical characteristic to deviate from the desired electrical characteristic and/or cause the tip 26 to drift away from the reference tip position. The micro-positioner 30 can trigger a repositioning of the tip 26 if measured sensor information deviates from the recorded sensor information by a predetermined margin, where the predetermined margin is set to a value of zero or greater than zero.

For example, the micro-positioner 30 can measure a vertical contacting force (Fz) in the Z-direction of the test probe needle 20 on the signal pad 12. The vertical contacting force Fz is a vertical force applied at the tip 26 of the test probe needle 20 as a result of its contact with the signal pad 12 (or lack thereof) that may cause a vertical displacement dz of the tip 26 in the vertical direction. In addition to the contacting force Fz and the vertical displacements dz corresponding to vertical tip positioning, the micro-positioner 30 is further configured to monitor and evaluate the sensor signals to measure lateral friction forces Fx and Fy and lateral displacements dx and dy corresponding to lateral tip positioning. The forces Fz, Fx, and Fy are orthogonal to each other and result in one or more types of deformation of the test probe needle 20. For example, a bending deformation B1 may be caused by forces Fz and Fx, with force Fz being the dominant contributing force to B1. Another bending deformation B2 may be caused by force Fy. Tension/compression deformation TC may be caused by forces Fz and Fx, with the force Fx being the dominant contributing force to TC. The micro-positioner 30 uses the measured forces to estimate and even predict displacements or shifts of the tip 26 in the lateral and vertical directions.

The tip 26 makes contact with a wafer surface such that the test probe needle 20 has a tilt angle θ with respect to the wafer surface. The tilt angle is established at a known quantity that is programmed at the micro-positioner 30 and used by the micro-positioner 30 to calculate forces Fx and Fz and well as any displacements dx and dz as a result thereof.

The micro-positioner 30 controls an actuator 31 or other positioning mechanism that is mechanically coupled to the test probe needle 20 to control a tip position thereof in all three directions. Thus, the micro-positioner 30 includes a processing circuit for processing sensor signals, measuring forces applied to the test probe needle 20 and/or measuring displacements and further includes a controller that is configured to perform active, real-time repositioning of the test probe needle tip 26 on the target signal pad 12 based on the measured forces/displacements. In particular, the micro-positioner 30 maintains the tip 26 of the test probe needle 20 at an established reference tip position on the signal pad 12 by actively monitoring and performing repositioning when needed. The actuator 31 performs the repositioning based on control signals received from the micro-positioner 30.

In the case of multiple test probe needles and multiple signal pads, the micro-positioner 30 and the actuator 31 may be responsible for repositioning the test probe needles as a whole. In this case, the micro-positioner 30 includes a central processor/controller for receiving sensor signals from each test probe needle and providing control signals to the actuator for performing repositioning of the test probe needles as a whole.

Figure 2A:
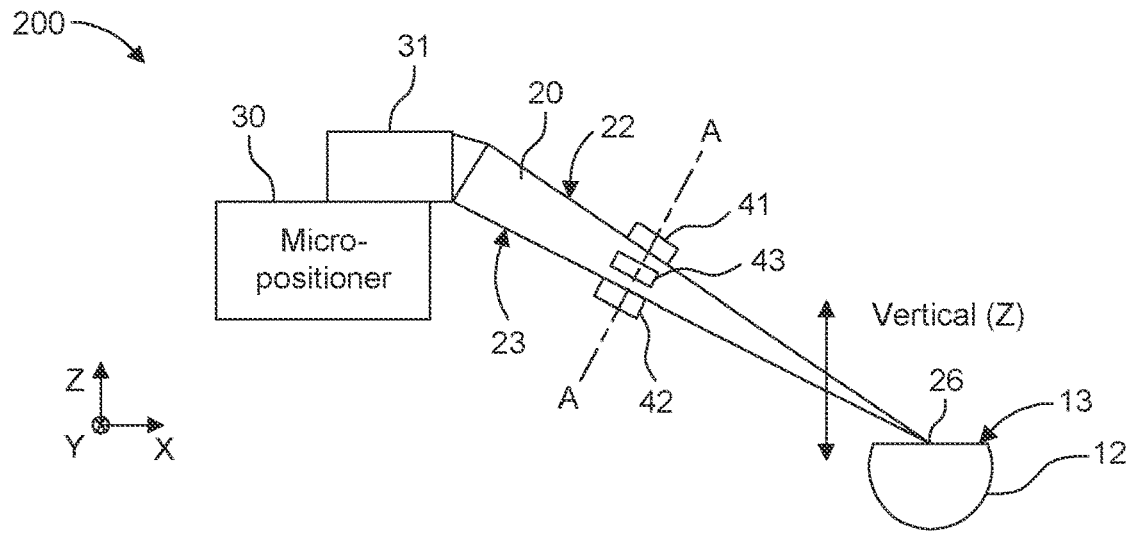
FIG. 2A is a side view of a wafer test probe system according to one or more embodiments.
Figure 2B:
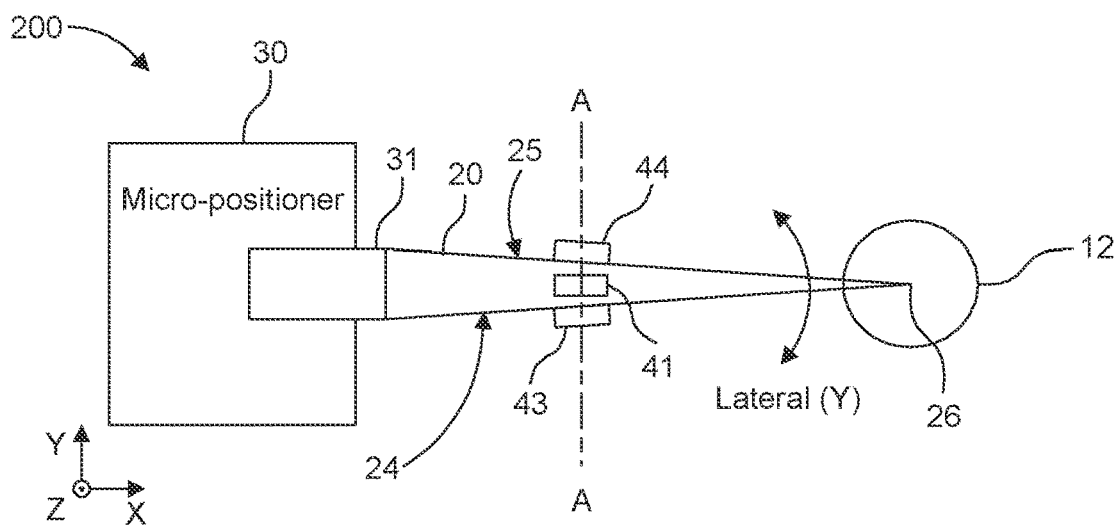
FIG. 2B is a top view of the wafer test probe system shown in FIG. 2A.
Figure 2C:
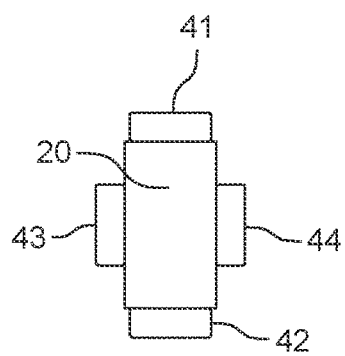
FIG. 2C is a further cross-section of a sensor area of a test probe that is part of the wafer test probe system shown in FIG. 2A, the cross-section being taken at cut line A-A.
Figure 2D:
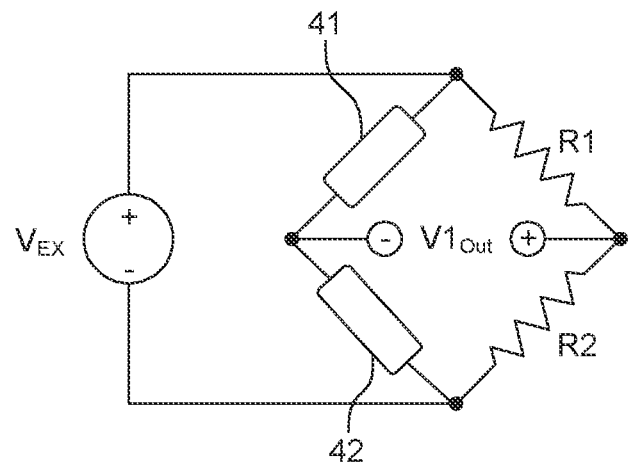
FIG. 2D is a schematic diagram of a first strain gauge bridge circuit configured to measure vertical (Z) stresses and forces acting on the test probe of the wafer test probe system shown in FIG. 2A.
Figure 2E:
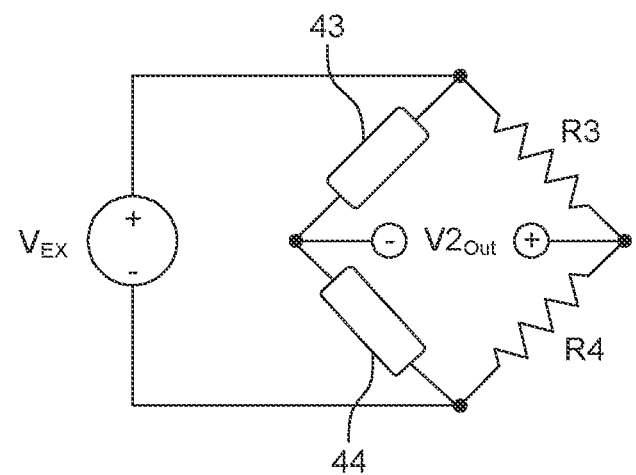
FIG. 2E is a schematic diagram of a second strain gauge bridge circuit configured to measure lateral (Y) stresses and forces acting on the test probe of the wafer test probe system shown in FIG. 2A.

FIG. 2A is a side view of a wafer test probe system 200 according to one or more embodiments. FIG. 2B is a top view of the wafer test probe system 200 shown in FIG. 2A. FIG. 2C is a further cross-section of a sensor area of a test probe needle that is part of the wafer test probe system 200 shown in FIG. 2A, the cross-section being taken at cut line A-A. FIG. 2D is a schematic diagram of a first strain gauge bridge circuit 201 configured to measure vertical (Z) stresses and forces acting on the test probe needle of the wafer test probe system 200 shown in FIG. 2A. FIG. 2E is a schematic diagram of a second strain gauge bridge circuit 202 configured to measure lateral (Y) stresses and forces acting on the test probe needle of the wafer test probe system 200 shown in FIG. 2A.

In the present example, strain gauge sensors are arranged on the surfaces of the test probe needle 20 in the sensing area 21. A strain gauge is a sensor element (referred to as a strain gauge element) whose electrical resistance varies with applied force. It converts surface strain—as a result of acting forces like compression, tension, etc.—into a change in electrical resistance which can then be measured. This resistance change can be measured using a Wheatstone bridge to which an excitation voltage Vex is supplied at two opposite terminals and an output voltage (e.g., V1out or V2out) representative of a change in electrical resistance is measured at the other two opposite terminals. A strain gauge element has a strain sensitive pattern configured to sense a force applied in a sensing direction (i.e., a strain direction). The strain sensitive pattern may be elongated or compressing in the sensing direction leading to a change in electrical resistance through the strain gauge. For example, a strain sensitive pattern may be configured to sense a force applied in the X-direction, the Y-direction, or Z-direction.

It will be appreciated that while forces acting on the tip in the Z and Y directions are independent from each other, forces acting on the tip 26 in the Z-direction or X-direction are not completely independent. For example, a positional shift or a force shift in the X-direction can be caused by a variation in elevation in the Z-direction, and vice versa. As a result, a movement in the X-direction would create a bending force in Z-direction due to compression/tension in the test probe needle 20 and a movement in the Z-direction would create bending force in the X-direction due to compression/tension in the test probe needle 20 in the X-direction. In the present example, detection of the vertical Z stress/force and the lateral Y stress/force are targeted. Further examples are provided below in which additional sensor elements are provided to also detect lateral X stress/force. In those examples, multiple strain gauge bridges may be provided, each one targeting the measurement of a one or more X, Y, or Z forces.

Each strain gauge sensor is a strain gauge bridge circuit (i.e., Wheatstone bridge circuit) comprising one or more strain gauges (i.e., strain gauge elements). A strain gauge bridge circuit may be either a half-bridge strain gauge circuit comprising two strain gauge elements arranged in a bridge configuration with two known resistors (e.g., R1 and R2, R3 and R4, or R5 and R6) or a full-bridge strain gauge circuit comprising four strain gauge elements arranged in a bridge configuration. The known resistors (e.g., R1 and R2, R3 and R4, or R5 and R6) are standard resistors that are not influenced or sensitive to external forces applied to the test probe needle and, thus, are substantially fixed.

Strain gauge elements of a strain gauge bridge circuit may be arranged on a same surface of the test probe needle 20, on opposite surfaces of the of the test probe needle 20, may have strain sensitive patterns sensitive to a same sensing direction (i.e., a same strain direction), or may have strain sensitive patterns sensitive to a different sensing directions (i.e., different strain directions) that may be orthogonal to each other. For example, one sensing direction (e.g., a principal direction) may extend lengthwise along the test probe needle 20 and another sensing direction (e.g., a transverse direction) may extend widthwise across the test probe needle 20, orthogonal to the principle direction.

Various combinations of half-bridge strain gauge circuits and full-bridge strain gauge circuits may be arranged in sensing area 21. Any half-bridge can be a substituted for a full-bridge and vice versa depending on the specific design constraints and required sensitivity, making both bridge types mutually exchangeable.

The wafer micro-positioner 30 is configured to monitor a position of the test probe needle 20 in the Y and Z dimensions using the sensors described herein. Specifically, the test probe needle 20 is established in a reference tip position with the desired contact of the tip 26 to a target surface 13 of the signal pad 12 at which desired contact properties (e.g., contact forces) and electrical properties (e.g., resistance, impedance, capacitance, etc.) between the test probe needle 20 and the wafer 10 are achieved. The test probe needle 20 is maintained in that reference tip position in an X-direction, a Y-direction, and a Z-direction. The X- and Y-directions are parallel to a wafer surface 14 and are representative of lateral, planar, or horizontal directions relative to a lateral positioning of the test probe needle 20 with respect to the signal pad 12. In contrast, the Z-direction extends perpendicular to the wafer surface 14 and is representative of a vertical direction relative to a vertical positioning of the test probe needle 20 with respect to the signal pad 12. Any deviation or displacement from the reference tip position is corrected by the micro-positioner 30 by repositioning of the test probe needle 20.

Furthermore, the micro-positioner 30 can predict displacements and proactively prevent de-positioning shifts via repositioning. The micro-positioner 30 may be configured as a detector such that any lateral frictional force or vertical contacting force greater than a predetermined margin from those forces initially established at setting the reference tip position can be detected and compensated to bring the detected force back to within the predetermined margin before any displacement in the probe tip 26 relative to the reference tip position occurs.

The measured forces are used by the micro-positioner 30 to determine how much repositioning is needed and in which one or more directions to bring the forces back to within the predetermined margin. The greater the magnitude of a detected force in a particular direction, the greater degree of repositioning is needed in the opposite direction to counteract that detected force. The micro-positioner 30 may monitor the forces during repositioning until all forces are compensated to within their respective predetermined margins and halt the repositioning when that condition is satisfied. As a detector, the micro-positioner 30 performs active monitoring and repositioning of the probe tip 26 relative to the target surface 13 of the signal pad 12 (i.e., the wafer surface) for fast tip positioning compensation.

The micro-positioner 30 may be configured to monitor lateral friction forces against respective reference values set between zero and the force of static friction (inclusive). For example, if a lateral friction force applied to tip 26 is less than or equal to the force of static friction, then the tip 26 may be on the verge of slipping or drifting but has not yet done so. Nevertheless, the lateral friction force would still cause deformation at the sensing area 21 that can be detected.

As noted above, the micro-positioner 30 may record the tip position as a reference tip position when a desired electrical characteristic is established during the initial placement of the test probe needle 20 on the wafer surface. The tip 26 also has vertical and lateral forces acting thereon at the reference tip position. Thus, when the reference tip position is set, there is also a corresponding vertical (Z)

contacting force, a corresponding lateral (X) friction force less the force of static friction, and a corresponding lateral (Y) friction force less the force of static friction acting on the tip 26. These three forces can be recorded by the micro-positioner 30 by way of their corresponding sensor information read out from one or more sensors at the time the reference tip position is initially established.

The micro-positioner 30 may be configured to take corrective action via repositioning of the tip 26 when a monitored force deviates from its reference value by more than a predetermined margin (i.e., it exceeds a predetermined threshold) to prevent the slippage or drifting of the tip 26 from the reference tip position. Of course, lateral slippage and drift resulting in a displacement in the lateral position of the tip 26 may also be detected and compensated for by repositioning of the tip 26.

In the side view shown in FIG. 2A, a first vertical strain gauge element 41 is disposed on an upper surface 22 of the test probe needle 20 and a second vertical strain gauge element 42 is oppositely disposed on a lower surface 23 of the test probe needle 20. The two vertical strain gauge elements 41 and 42 are used along with resistors R1 and R2 to form a vertical strain gauge sensor 201 (i.e., a strain gauge bridge) shown in FIG. 2D that is sensitive to forces in the Z-direction. More particularly, the strain gauge sensor 201 is sensitive to bending deformation B1 caused by bending stress resultant from dominant vertical contact force Fz and also lateral friction force Fx.

When the output voltage V1out of the vertical strain gauge sensor 201 is zero, the bridge is balanced and indicates there is no vertical contacting force acting on the tip 26.

When the tip 26 is initially established at the reference tip position, a vertical contacting force is present due to its contact with the pad surface 13. This causes the output voltage V1out to have a corresponding value at the time the reference tip position is initially established. The micro-positioner 30 is configured to record this value of the output voltage V1out as a reference value that is to be compared with the output voltage V1out during tip position monitoring. In this way, a deviation from a reference vertical contacting force in either the positive or negative Z direction can be monitored.

In other words, the resistances of the two vertical stain gauge elements 41 and 42 are at their reference resistance when the reference tip position is initially established, thereby establishing a baseline of any existing vertical deformation present in the test probe needle 20 caused by a reference vertical contacting force. However, when the vertical contacting force changes, it causes a vertical deformation in the test probe needle 20 to change. As a result, the resistances of the two vertical strain gauge elements 41 and 42 deviate from their reference resistances, and, as a consequence, the output voltage V1out of the vertical strain gauge sensor 201 deviates from it reference value.

The micro-positioner 30 receives the output voltage V1out and monitors for a change in vertical deformation. For example, micro-positioner 30 may monitor whether the output voltage V1out is within a predefined margin (in both positive and negative directions) from its reference value. In response to detecting a change in vertical deformation that causes the output voltage V1out to deviate outside of the predefined margin, the micro-positioner 30 repositions the test probe needle 20 (i.e., probe tip 26) a distance dz in the vertical direction such that the output voltage V1out returns back to within the predetermined margin from its reference value.

In addition, a first lateral strain gauge element 43 is disposed on a side surface 24 of the test probe needle 20 and a second lateral strain gauge element 44 is oppositely disposed on another side surface 25 of the test probe needle 20. The two lateral strain gauge elements 43 and 44 are used along with resistors R3 and R4 to form a lateral strain gauge sensor 202 (i.e., a strain gauge bridge) shown in FIG. 2E that is sensitive to forces in the Y-direction. More particularly, the strain gauge sensor 202 is sensitive to bending deformation B2 caused by bending stress resultant from lateral friction force Fy.

When the output voltage V2out of the lateral strain gauge sensor 202 is zero, the bridge is balanced and indicates there is no lateral (Y) friction force acting on the tip 26. When the tip 26 is initially established at the reference tip position, a lateral (Y) friction force is present due to its contact with the pad surface 13. This causes the output voltage V2out to have a corresponding value at the time the reference tip position is initially established. The micro-positioner 30 is configured to record this value of the output voltage V2out as a reference value that is to be compared with the output voltage V2out during tip position monitoring. In this way, a deviation in lateral friction forces in either the positive or negative Y direction can be monitored.

In other words, the resistances of the two lateral stain gauge elements 43 and 44 are at their reference resistance when the reference tip position is initially established, thereby establishing a baseline of any existing lateral Y deformation present in the test probe needle 20 caused by a reference lateral Y friction force. However, when lateral friction force changes, it causes a lateral (Y) deformation in the test probe needle 20 to change. As a result, the resistances of the two lateral strain gauge elements 43 and 44 deviate from their reference resistances, and, as a consequence, the output voltage V2out of the lateral strain gauge sensor 202 deviates from its reference value.

The micro-positioner 30 receives the output voltage V2out and monitors for a change in lateral deformation indicative of a lateral (Y) friction force. For example, micro-positioner 30 may monitor whether the output voltage V2out is within a predefined margin (in both positive and negative directions) from its reference value. In response to detecting a change in lateral deformation that causes the output voltage V2out to deviate outside of the predefined margin, the micro-positioner 30 repositions the test probe needle 20 (i.e., probe tip 26) a distance dy in the lateral direction such that the output voltage V2out returns back to within the predetermined margin from its reference value.

Figure 3A:
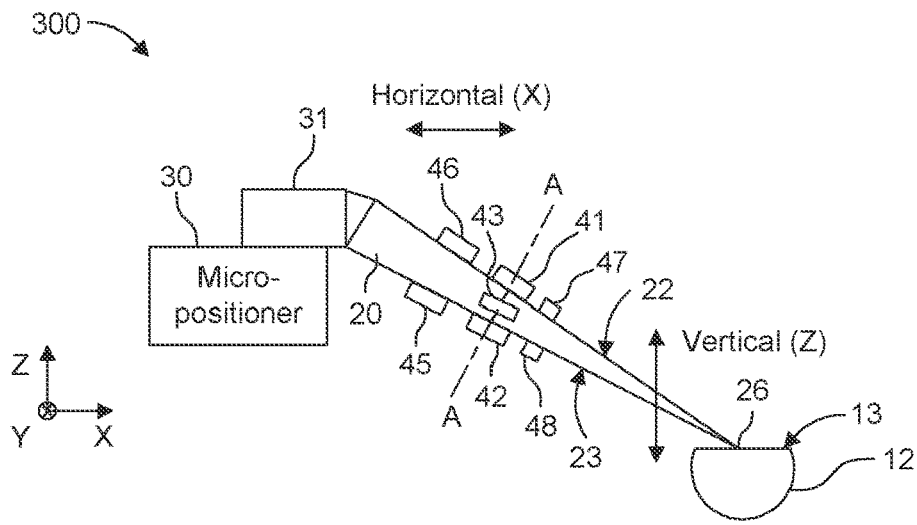
FIG. 3A is a side view of a wafer test probe system according to one or more embodiments.
Figure 3B:
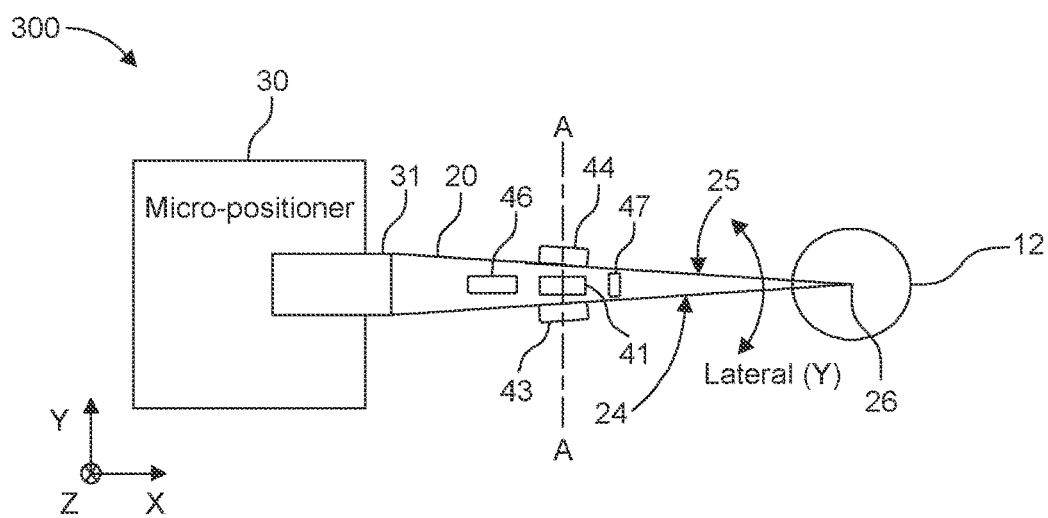
FIG. 3B is a top view of the wafer test probe system shown in FIG. 3A.

FIG. 3A is a side view of a wafer test probe system 300 according to one or more embodiments. FIG. 3B is a top view of the wafer test probe system 300 shown in FIG. 3A. The wafer test probe system 300 is similar to the wafer test probe system 200 with the exception that an additional strain gauge sensor arranged in a half-bridge configuration is provided by way of strain gauge elements 45 and 46 arranged on upper and/or lower surfaces 22 and 23. In addition, optional strain gauge elements 47 and 48 may be used in conjunction with strain gauge elements 41 and 42 to form a full-bridge configuration for strain gauge sensor 201. Alternatively, strain gauge elements 47 and 48 may be used in a half-bridge configuration instead of strain gauge elements 41 and 42 for strain gauge sensor 201.

Figure 3C:
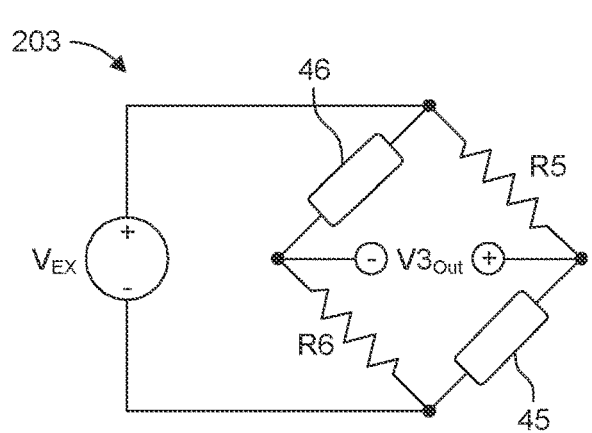
FIG. 3C is a schematic diagram of a third strain gauge bridge circuit configured to measure two orthogonal stresses and forces acting on the test probe of the wafer test probe system shown in FIG. 3A.

FIG. 3C is a schematic diagram of a third strain gauge bridge circuit 203 configured to measure forces Fz and Fx acting on the test probe needle of the wafer test probe system 300 shown in FIG. 3A. Thus, two orthogonal forces may be monitored by the micro-positioner 30 via the output voltage V3out of the third strain gauge bridge circuit 203.

Figure 3D:
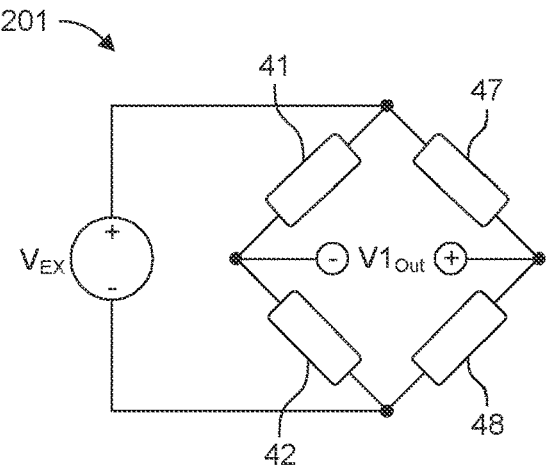
FIG. 3D is a schematic diagram of a strain gauge bridge circuit having a full-bridge configuration according to one or more embodiments.

FIG. 3D is a schematic diagram of the first strain gauge bridge circuit 201 having a full-bridge configuration with the addition of strain gauge elements 47 and 48.

The two lateral strain gauge elements 45 and 46 are used along with resistors R5 and R6 to form a strain gauge sensor 203 (i.e., a strain gauge bridge) shown in FIG. 3C that is sensitive to forces in the Z and X-directions. More particularly, the strain gauge sensor 203 is sensitive to tension/compression deformation TC caused by normal stress resultant from dominant lateral friction force Fx and also vertical contact force Fz. When the output voltage V3out of the strain gauge sensor 203 is zero, the bridge is balanced and those orthogonal forces are not present.

The strain gauge sensors 201 and 203 are configured to measure stresses that are orthogonal to each other, with one force Fz or Fx having a larger influence (dominance) over the other on the deformation. As can be seen, the strain gauge elements have a different arrangement for their bridges (i.e., the strain gauge sensors 201 and 203). One arrangement allows for measurement of the bending stress B1 and the other allows for measurement of the tension/compression stress TC. For strain gauge sensor 201, force Fz is the dominant force. Whereas, for strain gauge sensor 203, force Fx is the dominant force. In this way, the two strain gauge sensors 201 and 203 can be used to by the micro-positioner 30 to decouple the two forces force Fz or Fx from each other in order to determine these two forces. The micro-positioner 30 uses the sensor signals from both strain gauge sensors 201 and 203, as well as the predetermined tilt angle θ, to calculate the individual forces Fz and Fx.

When the tip 26 is initially established at the reference tip position, forces in the Z and X-directions are present due to its contact with the pad surface 13. This causes the output voltage V3out (and V1out) to have a corresponding value at the time the reference tip position is initially established. The micro-positioner 30 is configured to record the values of the output voltages V1out and Vout3 as a reference values that are to be compared with the output voltage V1out and Vout3 during tip position monitoring, respectively. In this way, a deviation from a reference vertical contacting force and a reference lateral X friction force in either the positive or negative Z and X directions can be monitored.

However, when either a vertical contacting forces or an X lateral friction force is present that causes a deformation in the test probe needle 20, the resistances of the two stain gauge elements 45 and 46 deviate from their reference resistances depending on the magnitude of each force being simultaneously present, and, as a consequence, the output voltage V3out of the strain gauge sensor 203 deviates from its reference value.

Because the movements in the X and Z directions are coupled, the output voltage V1out of the strain gauge sensor 201 would also deviate from its own reference value but by a different amount than a deviation of output voltage V3out from its reference value. Accordingly, the processing circuit of the micro-positioner 30 is configured to use both output voltages V1out and V3out, evaluate their deviations from their respective reference values to discriminate the magnitudes of the X frictional force and the Z vertical contacting force applied at the probe tip 26, and determine a repositioning of the probe tip 26 in both the X and Z-directions based on these determinations. In evaluating the deviations of V1out and V3out from their respective reference values, the micro-positioner 30 may also compare the deviation of V1out to the deviation of V3out to discriminate the magnitudes of the X frictional force and the Z vertical contacting force applied at the probe tip 26. Accordingly, the micro-positioner 30 may move the probe tip 26 a distance dx and dz to perform the repositioning and bring both V1out and V3out back to within their respective predefined margins from their respective reference values. Thus, the third strain gauge bridge circuit 203 is used in combination with the first strain gauge bridge circuit 201 to decouple the detection of X-directional forces and Z-directional forces from each other.

Figure 4A:
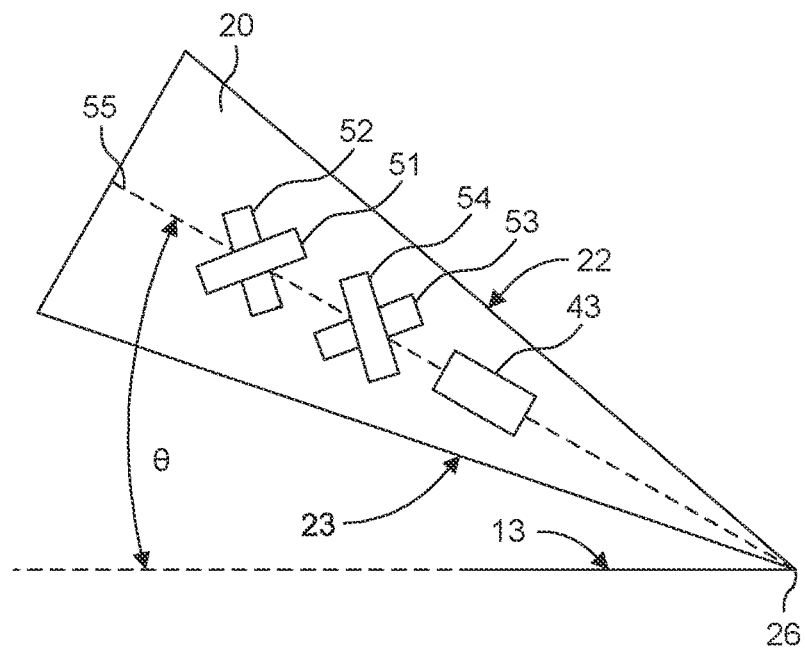
FIG. 4A is a cross-sectional view of a test probe with torsion sensing according to one or more embodiments.
Figure 4B:
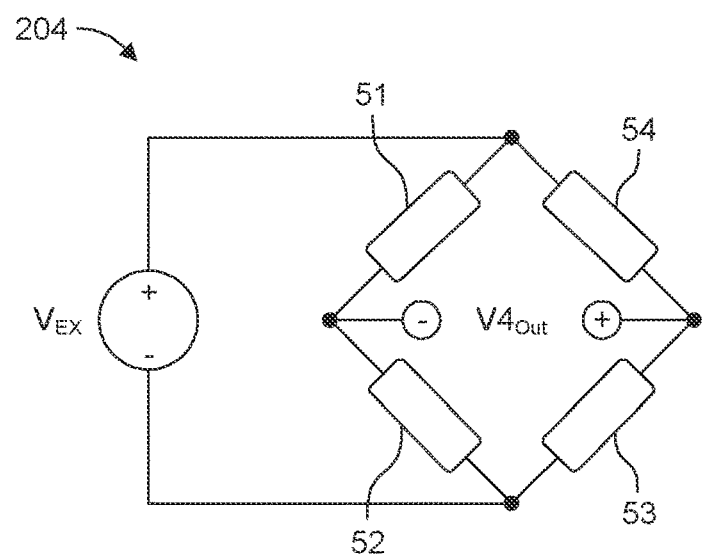
FIG. 4B is a schematic diagram of a fourth strain gauge bridge circuit configured to measure torsional forces acting on the test probe shown in FIG. 4A.

FIG. 4A is a cross-sectional view of a test probe needle 20 with torsion sensing according to one or more embodiments. FIG. 4B is a schematic diagram of a fourth strain gauge bridge circuit 204 configured to measure torsional forces acting on the test probe needle 20 shown in FIG. 4A. The test probe needle 20 has strain gauge sensor elements 43 and 44 arranged thereon in the manner described above to measure Y frictional force via monitoring the bending stress B2. The strain gauge sensor elements 51-54 are provided to form a full-bridge strain gauge sensor 204 that behaves as a strain gauge torsionmeter. The full-bridge strain gauge sensor 204 is configured to generate an output voltage V4out representative of a shear stress present in the test probe needle 20 due forces acting on probe tip 26. Probe torsion may result in lateral shifts that can be detected by the micro-positioner 30 and compensated via repositioning of the probe tip 26 in a similar manner described above.

To measure torsional stress, the strain gauge sensor elements 51-54 are arranged in superimposed (stacked) pairs, with the strain gauge sensor elements of each pair being arranged at 45° with respect to a center axis 55 and orthogonal to each other. In particular, strain gauge sensor elements 51 and 52 form a first superimposed pair that have their longest dimension extend orthogonal to each other and strain gauge sensor elements 53 and 54 form a second superimposed pair that have their longest dimension extend orthogonal to each other. The longest dimensions of each strain gauge sensor element 51-54 extends 45° with respect to a center axis 55.

Figure 5:
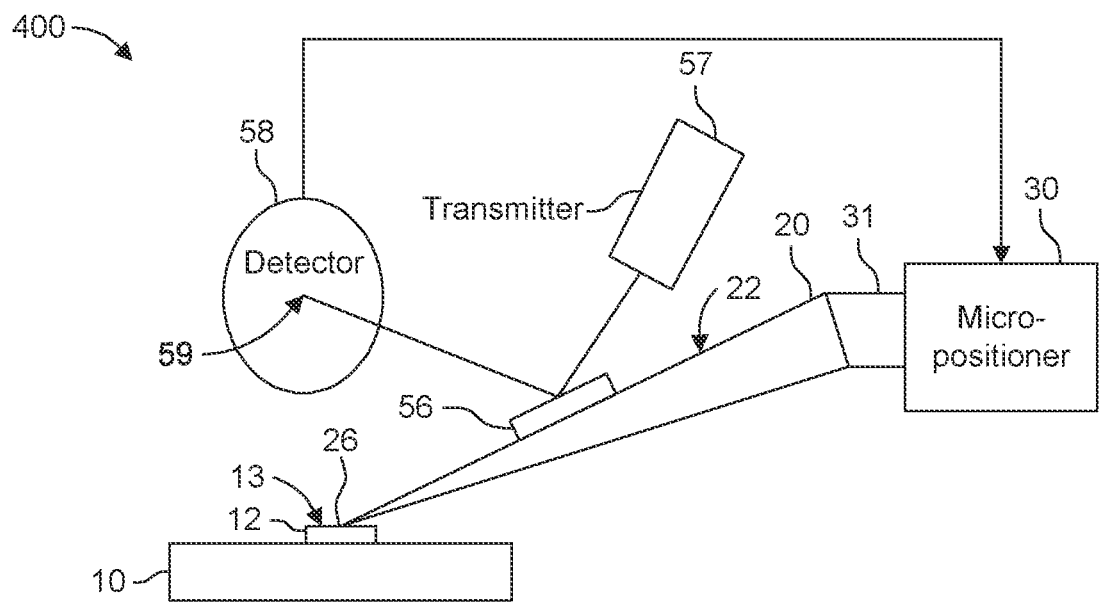
FIG. 5 shows a side view of a wafer test probe system according to one or more embodiments.

FIG. 5 shows a side view of a wafer test probe system 400 according to one or more embodiments. The wafer test probe system 400 uses optical sensing to detect vertical contacting forces and lateral friction forces between the probe tip 26 and the target surface 13 of the signal pad 12. The wafer test probe system 400 includes a reflective element 56 (e.g., a mirror or reflective coating), an optical transmitter 57 that transmits optical beams (e.g., collimated laser beams) at the reflective element 56, and an optical detector 58 (e.g., a two-dimensional position-sensitive detector or a two-dimensional image sensor) that receives reflected optical beams from the reflective element 56 at a point of incidence. The optical detector 58 is configured to generate sensor signals based on detected optical beams and transmit the sensor signals to the micro-positioner 30 for evaluation, where the sensor signals indicate a point of incidence or a deviation from a reference position 59 on the detector 58, where the reference position 59 is recorded by the micro-positioner 30 at the time the reference tip position is initially established. A sensor signal may include sensor information representative of a force in one dimension or forces in all three dimensions. In particular, the sensor signal may include first sensor information representative of the first lateral friction force based on the reflected optical beam, second sensor information representative of the second lateral friction force based on the reflected optical beam, and third sensor information representative of the vertical contacting force based on the reflected optical beam.

When the probe tip 26 is in its a reference position 59 relative to the target surface 13, a reflected light beam will be incident on the optical detector 58 in a corresponding reference position. When the test probe needle 20 undergoes any deformation as a result of X or Y friction forces or as a result of an increased or decreased Z contacting force, the reflected light beam will deviate from its reference position 59 on the optical detector 58. The micro-positioner 30 is configured to determine a repositioning of the probe tip 26 based the direction and the amount the point of incidence deviates from the reference position 59 at the optical detector 58. The micro-positioner 30 is configured to reposition the probe tip 26 until the point of incidence of a reflected light beam aligns with the reference position 59 or is at least at a distance that is within a tolerance margin from the reference position 59.

In addition, any of the strain gauge sensors 201, 202, and 203 may be applied in the wafer test probe system 400 with corresponding strain gauge elements 41-46 disposed on the test probe needle 20 to further discriminate between X, Y, and Z forces and/or displacements.

Figure 6:
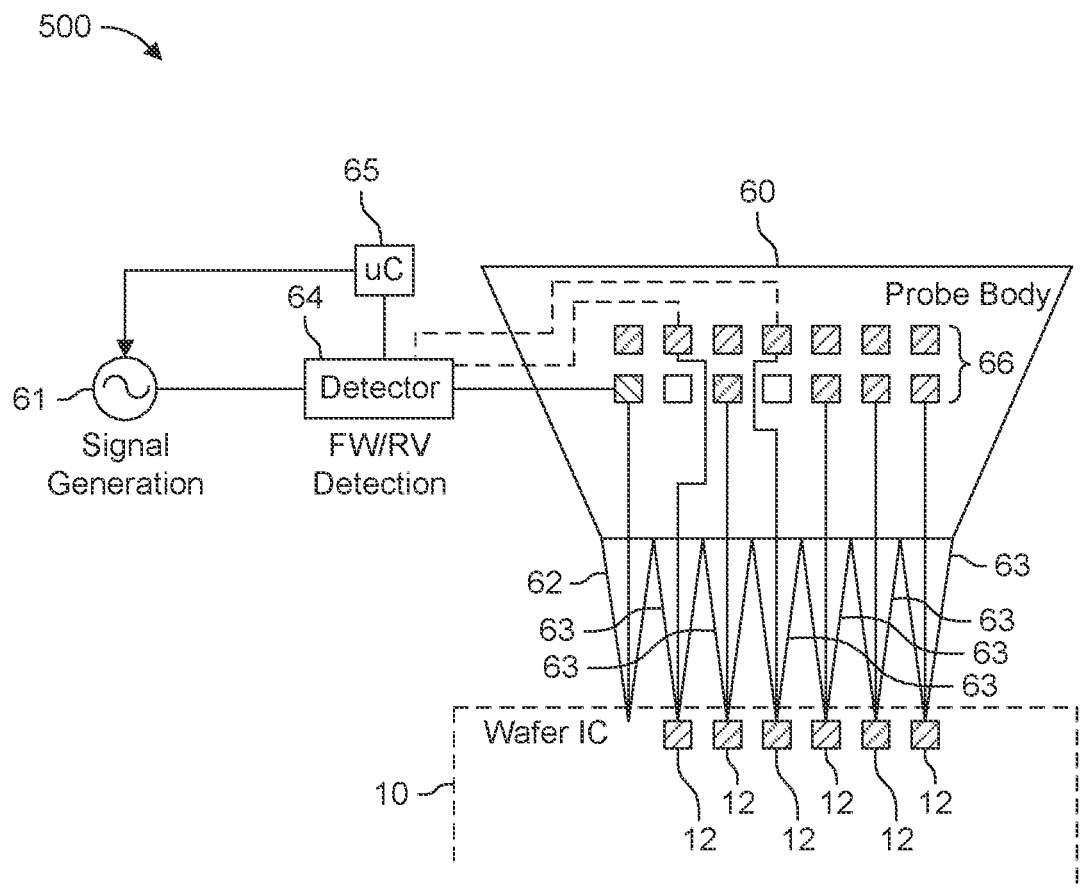
FIG. 6 is a schematic block diagram of an antenna element system according to one or more embodiments.

FIG. 6 is a schematic block diagram of an antenna element system 500 according to one or more embodiments. The system 500 includes a signal generator 61 that generates an AC signal whose frequency can be optimized considering the materials used for the actual realization of the test probe needle—and even wafer or specific applications. The system 500 further includes a probe body 60 that includes multiple test probe needles 62 and 63 extending therefrom and signal routing circuitry 66 that routes test signals from a signal source to respective test probe needles 62 and 63.

The AC signal is transmitted through one or more test probe needles 62 (i.e., a position detection test probe needle) via a signal pathway and is reflected back through the test probe needle by surface of the wafer 10 or one of the signal pads 12. The AC signal is a position test signal that travels through a selected test probe needle 62 to a wafer surface and is reflected back by the wafer surface, through the selected test probe needle 62, to a detector 64. Additional test probe needles 63 of a probe body 60 are also provided that are in contact with a wafer surface, for example, a corresponding signal pad 12. The probe card 60 includes signal routing circuitry 66 that injects wafer test signals into and extracts wafer test signals from respective test probe needles 63 to measure an electrical characteristic from a respective test probe needle 63.

The system 500 further includes a detector 64 that detects forward and reverse characteristics (amplitude and/or phase) of the transmitted and reflected AC signal, respectively, and a microcontroller 65 receives the detected forward and reverse characteristics (amplitude and/or phase) for analysis. For example, the microcontroller 65 may analyze the forward characteristics of the transmitted AC signal prior to testing to ensure the transmitted AC signal is optimized for the materials used for the actual realization of the test probe needle—and even wafer or specific applications (i.e., optimized for the material of the targeted wafer surface). The microcontroller 65 may transmit control signals to the signal generator 61 to make adjustments to the transmitted AC signal until the desired signal characteristics (e.g., amplitude, phase, and frequency) are achieved in order to proceed to testing. Additionally, the microcontroller 65 may analyze the reverse characteristics of the reflected AC signal to monitor a positioning of the needle tip of test probe needle 62. It will also be appreciated that a forward characteristic detector and a separate reverse characteristic detector arranged on different signal paths may also be used.

When the test probe needle 62 has been landed in the correct (reference) position on the wafer IC 10 (e.g., by an operator) with a correct vertical contacting force, the detected values of the reverse characteristics can be used as reference values. Thus, when a reference tip position is initially established, the microcontroller 65 can record the reverse characteristics of the reflected AC signal as reference values. Once the reference values are stored, the microcontroller 65 can perform position monitoring by monitoring the reverse characteristics of additional reverse characteristics measurements of the reflected AC signal against the reference values.

When the test probe needle 62 becomes misaligned from that reference tip position and/or when one or more forces acting on the tip changes from a reference value, one or more of the reverse characteristics in the reflected AC signal will change. In other words, a misalignment from the reference tip position would cause a change in reflectivity of the AC signal, thereby changing one or more signal characteristics. The microcontroller 65 may compare the measured signal characteristics obtained during tip position monitoring to their respective reference values and trigger a reposition when one or more measured signal characteristics deviate from their respective reference values by a predefined margin.

The detected change in the reverse characteristics can then be used by the microcontroller 65 as information for reposition compensation. The alignment of the test probe needle 62 with its reference tip position ensures that the other test probe needles 63 are properly in contact with their corresponding signal pads 12. All test probe needles 62 ad 63 are fixed to the probe body 60. Thus, their respective positions may be fixed relative to each other and the probe body 60 may be repositioned to adjust the tip placement of each of the test probe needles 62 and 63.

In addition, the AC signal or a different AC signal may be routed through additional test probe needles 63 to provide additional accuracy in position sensing. For example, if the AC signal is routed through test probe needle 62 and two test probe needles 63 (e.g., via the solid signal path and the optional dotted signal paths), triangulation on position sensing may be used by the microcontroller 65 to detect probe misalignment without special structures on wafer-level. The triangulation in position would allow the microcontroller 65 to determine displacements in the XY plane of the wafer IC 10 from a reference position and to determine countermeasures in repositioning to move the test probe needles 62 and 63 back to their reference tip positions. In this way, using two or more test probe needle for position monitoring provides more accurate position information in all three dimensions.

Thus, with respect to a single (first) test probe needle placed at a first tip position, the detector 64 is configured to receive a reflected AC test signal reflected by the wafer surface and transmitted through the first test probe needle and evaluate a characteristic (or more than one characteristic) of the reflected test signal. The microcontroller 65 is configured to compare the evaluated characteristic to a corresponding reference characteristic, detect a first deviation on a condition that the evaluated characteristic deviates from the reference characteristic, and reposition the tip of the first test probe needle to counteract the first deviation in order to maintain the tip of the first test probe needle at the first tip position.

With respect to using an additional (second) test probe needle placed at a second tip position, the detector 64 is configured to receive a reflected AC test signal reflected by the wafer surface and transmitted through the second test probe needle and evaluate a characteristic (or more than one characteristic) of the reflected test signal. The microcontroller 65 is configured to compare the evaluated characteristic to a corresponding reference characteristic, detect a second deviation on a condition that the evaluated characteristic deviates from the reference characteristic. The microcontroller 65 can then use the detected first and/or second deviations to perform a repositioning of the probe body 60 to reposition all the test probe needles. For example, the microcontroller 65 may reposition the probe body 60 to counteract the first deviation and the second deviation in order to maintain the tip of the first test probe needle at the first tip position and to maintain the tip of the second test probe needle at the second tip position.

Additional AC test signals can be transmitted through additional test probe needles and their reverse characteristics can be evaluated in a similar manner through additional signal pathways of the routing circuitry 66 that are not explicitly illustrated. A deviation from a corresponding reference characteristic can be monitored for each reflected AC test signal (i.e., for each selected test probe needle) and the microcontroller 65 can used each detected deviation to perform a controlled repositioning of the probe body 60 in three dimensions. In this way, the tips of each of the test probe needles can be maintained in their initially set tip positions to ensure accurate wafer measurements over time.

In view of the above, improved measurement quality for wafer-level characterization/verification/test may be achieved due to near-perfect contacting and positioning of probes. The above-described systems also provide a well-defined and constant electrical interface probe-device-under-test with desired resistance, RF impedance matching, etc. The systems are configured to maintain a constant contacting position on the signal pad 12, maintain a constant contact interface (electrical resistance) between the tip probe 25 and the signal pad 12, and reduced wear on the signal pads 12 and the test probe needles 20 by eliminating movement, friction, rubbing, etc.

The above-described systems also reduced the risk of having to repeat measurements due to probe tip drift. The above-described systems also enable long-term RF measurements at the wafer-level with unchanged electrical interfaces and possibly over large temperature ranges—reducing measurement time and operator effort, providing the possibility to fully-automated, remotely-controlled on-wafer characterization.

While various embodiments have been described, it will be apparent to those of ordinary skill in the art that many more embodiments and implementations are possible within the scope of the disclosure. Accordingly, the invention is not to be restricted except in light of the attached claims and their equivalents.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

In summary, although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A wafer probe alignment system, comprising:
   a test probe needle comprising a body having a tip that is configured to make contact with a surface of a wafer at a first tip position, wherein the body is deformable and includes a sensing area that undergoes a deformation in response to at least one force applied to the tip, wherein the at least one force includes a first lateral friction force that is applied in a first lateral direction parallel to the surface of the wafer;
   at least one sensor configured to monitor the sensing area for deformation caused by the first lateral friction force and generate at least one first sensor information representative of the first lateral friction force; and
   a controller configured to control a position of the tip, wherein the controller is configured to receive the at least one first sensor information and reposition the tip to counteract the first lateral friction force in order to maintain the tip at the first tip position.

2. The wafer probe alignment system of claim 1, wherein:
   the controller is configured to measure at least one electrical characteristic between the tip and the wafer, and initially set the tip at the first tip position in response to the at least one electrical characteristic satisfying predetermined criteria.

3. The wafer probe alignment system of claim 1, wherein:
the at least one first sensor information has a first predetermined value initially recorded at the first tip position by the controller, and
the controller is configured to reposition the tip to counteract the first lateral friction force in response to the at least one first sensor information deviating from the first predetermined value by more than a predetermined margin such that the at least one first sensor information is compensated back to be within the predetermined margin from the first predetermined value.

4. The wafer probe alignment system of claim 3, wherein the first predetermined value is equal to a value equal to or greater than zero and equal to or less than a value that is equivalent to a force of static friction of the tip in the first lateral direction.

5. The wafer probe alignment system of claim 3, wherein the controller prevents lateral displacement of the tip from the first tip position in the first lateral direction.

6. The wafer probe alignment system of claim 1, wherein the at least one sensor includes a first strain gauge sensor arranged on the sensing area of the body and configured to detect the deformation caused by the first lateral friction force and generate the at least one first sensor information representative of the first lateral friction force.

7. The wafer probe alignment system of claim 1, wherein:
the at least one force includes a vertical contacting force applied in a vertical direction orthogonal to the surface of the wafer,
the at least one sensor is configured to monitor the sensing area for deformation caused by the vertical contacting force and generate at least one second sensor information representative of the vertical contacting force, and
the controller is configured to receive the at least one second sensor information and reposition the tip to counteract the vertical contacting force in order to maintain the tip at the first tip position with a target vertical contact force between the tip and the surface of the wafer.

8. The wafer probe alignment system of claim 7, wherein the first lateral friction force applied in the first lateral direction is independent from the vertical contacting force applied in a vertical direction orthogonal to the surface of the wafer.

9. The wafer probe alignment system of claim 7, wherein the first lateral friction force applied in the first lateral direction is coupled to a vertical contacting force applied in a vertical direction orthogonal to the surface of the wafer.

10. The wafer probe alignment system of claim 1, wherein:
the at least one force includes a second lateral friction force that is applied in a second lateral direction parallel to the surface of the wafer and orthogonal to the first lateral direction;
the at least one sensor is configured to monitor the sensing area for deformation caused by the second lateral friction force and generate at least one second sensor information representative of the second lateral friction force, and
the controller is configured to receive the at least one second sensor information and reposition the tip to counteract the second lateral friction force in order to maintain the tip at the first tip position.

11. The wafer probe alignment system of claim 10, wherein the at least one sensor includes:
a first strain gauge sensor arranged on the sensing area of the body and configured to detect the deformation caused by the first lateral friction force and generate the at least one first sensor information representative of the first lateral friction force; and
a second strain gauge sensor arranged on the sensing area of the body and configured to detect the deformation caused by the second lateral friction force and generate the at least one second sensor information representative of the second lateral friction force.

12. The wafer probe alignment system of claim 10, wherein:
the at least one force includes a vertical contacting force applied in a vertical direction orthogonal to the surface of the wafer,
the at least one sensor is configured to monitor the sensing area for deformation caused by the vertical contacting force and generate at least one third sensor information representative of the vertical contacting force, and
the controller is configured to receive the at least one third sensor information and reposition the tip to counteract the vertical contacting force in order to maintain the tip at the first tip position with a target vertical contact pressure between the tip and the surface of the wafer.

13. The wafer probe alignment system of claim 12, wherein the at least one sensor includes:
a first strain gauge sensor arranged on the sensing area of the body and configured to detect the deformation caused by the first lateral friction force and generate the at least one first sensor information representative of the first lateral friction force;
a second strain gauge sensor arranged on the sensing area of the body and configured to detect the deformation caused by the second lateral friction force and the vertical contacting force and generate the at least one second sensor information representative of the second lateral friction force and the vertical contacting force;
a third strain gauge sensor arranged on the sensing area of the body and configured to detect the deformation caused by the second lateral friction force and the vertical contacting force and generate the at least one third sensor information representative of the second lateral friction force and the vertical contacting force,
wherein the controller is configured to evaluate a difference between the at least one second sensor information and the at least one third sensor information and determine the second lateral friction force and the vertical contacting force based on the difference.

14. A method of maintaining alignment of a test probe needle on a surface of a wafer at a first tip position, wherein the test probe needle comprises a body having a tip that is configured to make contact with the surface of the wafer at the first tip position, wherein the body is deformable and includes a sensing area that undergoes a deformation in response to at least one force applied to the tip based on the contact with the surface of the wafer, wherein the at least one force includes a first lateral friction force that is applied in a first lateral direction parallel to the surface of the wafer, the method comprising:
monitoring, by at least one sensor, the sensing area for deformation caused by the first lateral friction force;
generating, by the at least one sensor, at least one first sensor information representative of the first lateral friction force; and
controlling, by a controller, a position of the tip, including repositioning the tip based on the at least one first sensor information in order to counteract the first lateral friction force and to maintain the tip at the first tip position.

15. The method of claim 14, further including:

measuring, by the controller, at least one electrical characteristic between the tip and the wafer; and initially setting, by the controller, the tip at the first tip position in response to the at least one electrical characteristic satisfying predetermined criteria.

16. The method of claim 14, wherein:

the at least one first sensor information has a first predetermined value initially recorded at the first tip position by the controller, and repositioning the tip includes repositioning the tip to counteract the first lateral friction force in response to the at least one first sensor information deviating from the first predetermined value by more than a predetermined margin such that the at least one first sensor information is compensated back to be within the predetermined margin from the first predetermined value.

17. The method of claim 16, wherein the first predetermined value is equal to a value equal to or greater than zero and equal to or less than a value that is equivalent to a force of static friction of the tip in the first lateral direction.

* * * * *